United States Patent
Yoo et al.

(10) Patent No.: US 9,343,696 B2
(45) Date of Patent: May 17, 2016

(54) ADHESIVE FILM

(71) Applicant: LG CHEM, LTD., Seoul (KR)

(72) Inventors: Hyun Jee Yoo, Daejeon (KR); Suk Ky Chang, Daejeon (KR); Seung Min Lee, Daejeon (KR)

(73) Assignee: LG Chem, Ltd., Seoul (KR)

(*) Notice: Subject to any disclaimer, the term of this patent is extended or adjusted under 35 U.S.C. 154(b) by 0 days.

(21) Appl. No.: 14/337,990

(22) Filed: Jul. 22, 2014

(65) Prior Publication Data

US 2014/0332782 A1    Nov. 13, 2014

Related U.S. Application Data

(63) Continuation of application No. PCT/KR2013/000894, filed on Feb. 4, 2013.

(30) Foreign Application Priority Data

Feb. 3, 2012 (KR) .................. 10-2012-0011358
Feb. 4, 2013 (KR) .................. 10-2013-0012594

(51) Int. Cl.
*H01L 51/52* (2006.01)
*H01L 51/56* (2006.01)
(Continued)

(52) U.S. Cl.
CPC .............. *H01L 51/5246* (2013.01); *C09J 7/00* (2013.01); *C09J 7/02* (2013.01); *C09J 7/0242* (2013.01); *H01L 51/5237* (2013.01); *C08K 5/0025* (2013.01); *C09J 2201/128* (2013.01);
(Continued)

(58) Field of Classification Search
CPC .... H01L 51/5246; H01L 51/5237; C09J 7/02; C09J 7/0242; C09J 7/00; C09J 2201/128; C09J 2400/163; C09J 2203/03; C09J 2203/322; C09J 2201/40; C09J 2205/102; C08J 5/18; Y10T 428/1471; Y10T 428/2848; Y10T 156/1052; Y10T 428/2835; Y10T 428/26; C08K 5/0025; B32B 37/00; B32B 37/12

See application file for complete search history.

(56) References Cited

U.S. PATENT DOCUMENTS

| | | | |
|---|---|---|---|
| 2004/0104673 A1 | 6/2004 | Hosokawa et al. | |
| 2004/0164676 A1* | 8/2004 | Omura | H05B 33/04 313/512 |

(Continued)

FOREIGN PATENT DOCUMENTS

| | | |
|---|---|---|
| CN | 1295311 A | 5/2001 |
| CN | 101085905 A | 12/2007 |

(Continued)

*Primary Examiner* — Donald Raleigh
(74) *Attorney, Agent, or Firm* — Dentons US LLP (57) ABSTRACT

An adhesive film, a method for preparing an adhesive film, and an organic electronic device are provided. According to the adhesive film in exemplary embodiments of the present invention, fluidity of an adhesive can be controlled in the case of applying the adhesive between objects to be subsequently adhered to each other and then thermal-compressing by including an adhesive layer with cured side faces contacting with the outside. The adhesive film is used, for example for assembling a panel and the like, and thereby a defect rate at the time of assembling a panel and the like can be reduced and excellent work characteristics can be provided. In addition, before being applied to a panel or the like, a moisture absorbent included inside an adhesive layer of an adhesive film can be protected from external moisture or the like, thereby being easily stored, and also when it is applied to a product, reliability of life span, and the like can be secured.

14 Claims, 4 Drawing Sheets

(51) Int. Cl.
    *H05B 33/04*     (2006.01)
    *C09J 7/00*     (2006.01)
    *C09J 7/02*     (2006.01)
    *C08K 5/00*     (2006.01)

(52) U.S. Cl.
    CPC ........ *C09J2201/40* (2013.01); *C09J 2203/322* (2013.01); *C09J 2205/102* (2013.01); *C09J 2400/163* (2013.01); *H01L 2251/566* (2013.01); *Y10T 156/1052* (2015.01); *Y10T 428/1471* (2015.01); *Y10T 428/26* (2015.01); *Y10T 428/2835* (2015.01); *Y10T 428/2848* (2015.01)

(56) References Cited

U.S. PATENT DOCUMENTS

| | | | |
|---|---|---|---|
| 2005/0017633 A1 | 1/2005 | Miyadera | |
| 2006/0178073 A1* | 8/2006 | Seki | H01L 51/5237 445/24 |
| 2006/0246279 A1* | 11/2006 | Urairi et al. | 428/345 |
| 2008/0233712 A1 | 9/2008 | Sekiya | |
| 2010/0015784 A1* | 1/2010 | Nakamura et al. | 438/464 |
| 2010/0283384 A1* | 11/2010 | Lifka | H01L 51/5237 313/504 |
| 2011/0133637 A1 | 6/2011 | Ota | |
| 2011/0199564 A1* | 8/2011 | Moriwaki | G02F 1/136227 349/122 |
| 2011/0256334 A1* | 10/2011 | Edwards et al. | 428/69 |
| 2012/0108013 A1* | 5/2012 | Fujisawa et al. | 438/123 |
| 2012/0146487 A1* | 6/2012 | Kim | H01L 27/3276 313/504 |

FOREIGN PATENT DOCUMENTS

| | | | |
|---|---|---|---|
| CN | 101179032 A | | 5/2008 |
| JP | 10-200258 A | | 7/1998 |
| JP | 2000-219855 A | | 8/2000 |
| JP | 2005-158923 A | | 6/2005 |
| JP | 2008-50471 A | | 3/2008 |
| JP | 2008-51847 A | | 3/2008 |
| JP | 2010-53310 A | | 3/2010 |
| JP | 2010-080292 A | | 4/2010 |
| JP | 2010-080293 A | | 4/2010 |
| JP | 2010103040 A | | 5/2010 |
| JP | 2011-032318 A | | 2/2011 |
| JP | 2011032318 A | * | 2/2011 ................ C09J 7/02 |
| TW | I480355 B | | 4/2015 |
| WO | 02/05361 A1 | | 1/2002 |
| WO | 2008095653 A1 | | 8/2008 |

* cited by examiner

ADHESIVE FILM

This application is a Continuation Bypass Application of International Patent Application No. PCT/KR2013/000894, filed on Feb. 4, 2013, and claims the benefit of Korean Patent Application Nos. 10-2012-0011358, filed on Feb. 3, 2012 and 10-2013-0012594, filed on Feb. 4, 2013, in the Korean Intellectual Property Office, all of which are incorporated herein by reference in their entirety.

TECHNICAL FIELD

The present application relates to an adhesive film, a method for preparing an adhesive film, and an organic electronic device.

BACKGROUND ART

An adhesive film is available in various fields requiring adhesion. Especially, the adhesive film can be used to protect an element or device that is susceptible to external factors, such as moisture or oxygen.

Figure 1:
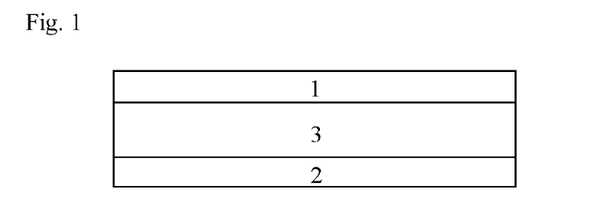
FIG. 1 is a cross-sectional diagram illustrating an adhesive film according to the conventional technology.

As illustrated in FIG. 1, an adhesive film is prepared to have a structure having an adhesive layer 3 in an uncured state, at least one protective film 1 or 2 for preventing adhesion of foreign substances to the adhesive layer, and the like. In addition, the adhesive film used for protecting an element or device that is susceptible to external factors, such as moisture or oxygen, mostly includes a moisture absorbent, and the like.

However, in general, an adhesive film is not subjected to the following process directly after being produced. In a general case, the adhesive film is distributed, or stored before being used in an adhesion process. Therefore, as illustrated in FIG. 1, in the case of exposing side faces of an adhesive layer to external air, a moisture absorbent included in the adhesive layer loses its function due to moisture in the air during a distribution and/or storage process of the adhesive film. Therefore, a problem in which such an adhesive film cannot properly play a role in encapsulating an element or device may be present.

In addition, at the time of encapsulating an element or device with an adhesive film, the adhesive film is disposed between an upper panel and a lower panel and then thermo-compressed. In this case, a defect in which part of an adhesive layer in an uncured state leaks out of the adhesive film, thereby not forming an adhesive layer having a uniform thickness, may occur.

DISCLOSURE

Technical Problem

An object of the present application is to provide an adhesive film, a method for preparing an adhesive film, and an organic electronic device.

Technical Solution

Figure 2:
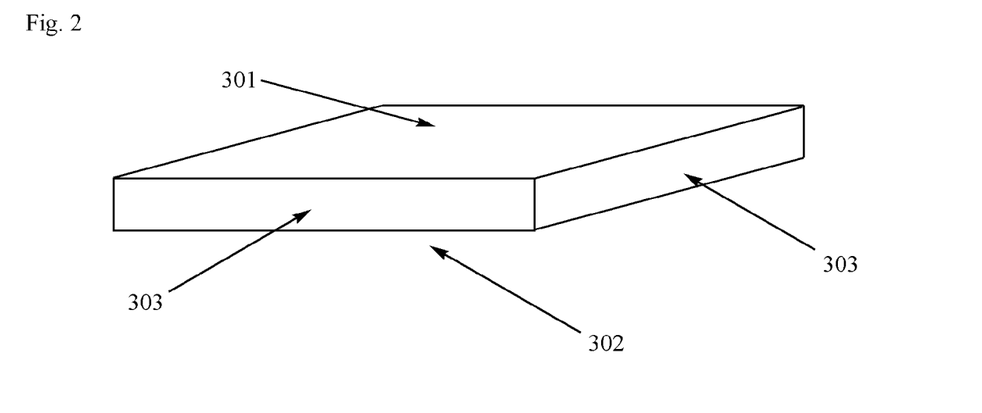
FIG. 2 is a diagram for illustrating a surface of an exemplary adhesive layer.

An embodiment of the present application provides an adhesive film including an adhesive layer having a side cured part. As illustrated in FIG. 2, as an example, such an adhesive layer may include: a first adhesive face 301 and a second adhesive face 302; and side faces 303 connecting the first and second adhesive faces. In addition, the adhesive layer may include a side cured part formed on a side face of at least any part of the side faces 303. However, the present invention is not limited thereto, and it is possible that the adhesive layer may be formed in a form different from that in FIG. 2.

Figure 3:
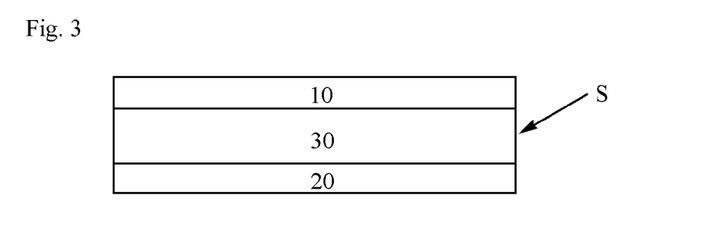
FIG. 3 is a diagram for illustrating a side face of an exemplary adhesive layer.

In the present specification, the term "side face" may mean a face not directly contacting to a substance to be adhered, or adhesion substance. In other words, it may mean a face, in which an adhesive layer is contacted with the outside. For example, a first and second adhesive faces of the adhesive layer may be adhered to or deposited with a protective film or metal thin film 10 or 20 in order to prevent adhesion of foreign substances or the like as illustrated in FIG. 3. In this case, a face marked with S is exposed to external air, and in such an exemplary case, a side face may mean a face marked with S. Here, the time of exposing the side face of the adhesive layer to external air may be any one time during distribution, storage, or used process of an adhesive film. In addition, the term "cured part" may mean a part, in which components capable of being cured by a heat supply, an aging process, or irradiation of an electromagnetic wave are cured by any one of these. At this time, the cured part may mean a part exhibiting a degree of curing of 50% or more or 80% or more, for example. For example, a degree of curing as used herein may be defined as a percentage (H2/H1×100) of heat of curing (H2) generated during post-curing of a sample to be measured for a degree of curing to heat of curing (H1) generated during post-curing of an uncured sample. In addition, heat of curing may be obtained by measuring heat generated during heating a sample at a heating rate of about 10° C./min using a differential scanning calorimetry (DSC).

A side cured part is present on a side face of an adhesive layer, and thus an adhesive film can obtain reliability for a long time during distribution and storage thereof. In addition, even when fluidity increases at the time of thermo-compressing, a flowing-out phenomenon of an adhesive composition of the adhesive film can be prevented due to the side cured part of the adhesive film. Therefore, an adhesive film as used herein can provide a cured adhesive layer or encapsulation layer having a uniform thickness even in the case of bonding a large-area object.

An adhesive layer includes a side cured part on a side face of at least any part of side faces. A site having the side cured part may be controlled according to use, a distribution, and/or a storage process of an adhesive film.

Figure 4:
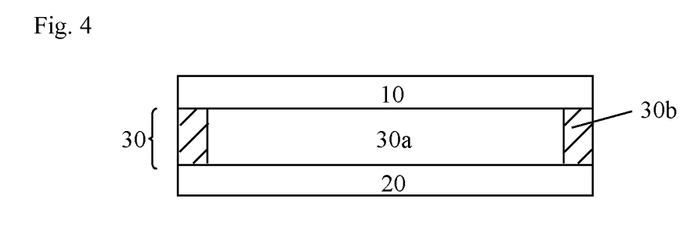
FIG. 4 is a cross-sectional diagram illustrating an adhesive film according to an example.
Figure 5:
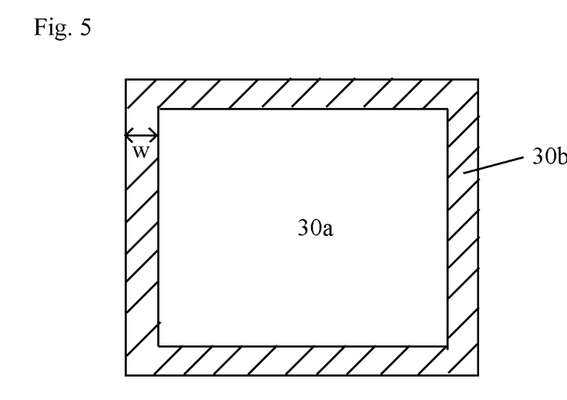
FIG. 5 is a schematic diagram illustrating an adhesive layer of an adhesive film as illustrated in FIG. 4 when viewed from above.
Figure 6:
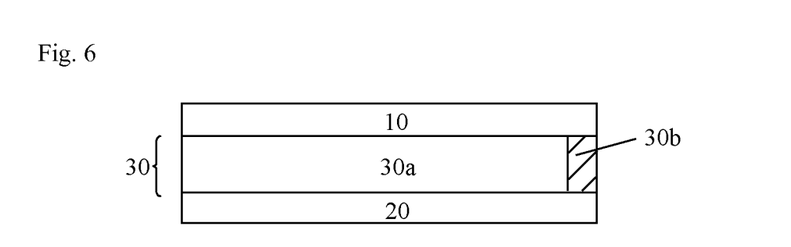
FIG. 6 is a cross-sectional diagram illustrating an adhesive film according to another example.
Figure 7:
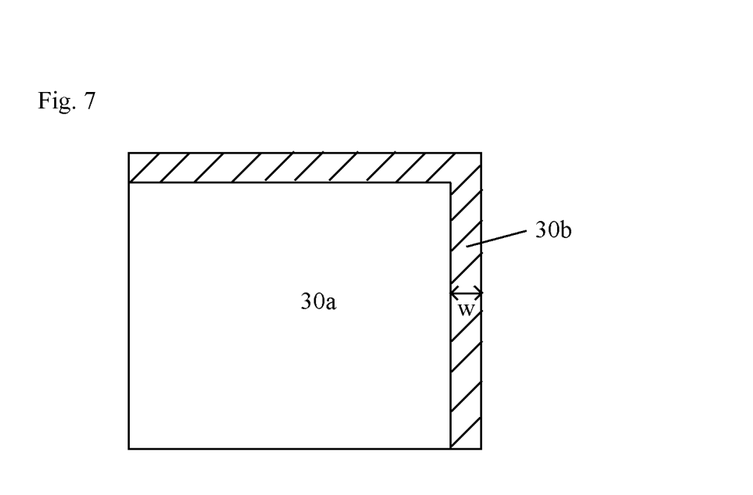
FIG. 7 is a schematic diagram illustrating an adhesive layer of the adhesive film in FIG. 6 when viewed from above.

As an embodiment, an adhesive film may include an adhesive layer 30 having a side cured part 30b on the entire side faces as illustrated in FIGS. 4 and 5. In a case where the adhesive layer includes a side cured part on the entire side faces thereof, deterioration of adhesive layer function due to external factors such as moisture or oxygen in the air can be blocked. However, the present invention is not limited thereto. As another embodiment, an adhesive film may include an adhesive layer 30 having a side cured part 30b on a side face of any part of side faces as illustrated in FIGS. 6 and 7. In this case, a component having smaller functional damage due to external factors can be used as a component for the adhesive layer.

A side cured part may be formed in a fine width on a side face of an adhesive layer. The width of a side cured part as used herein may be a length (W) from a side face to a point forming a cured part when observing a first and second adhesive faces of the adhesive layer as illustrated in FIGS. 5 and 7. The width of the side cured part may be controlled, for example, in a range of 0.5 μm to 1000 μm, 0.5 μm to 800 μm, 0.5 μm to 600 μm, 0.5 μm to 400 μm, 0.5 μm to 200 μm, 0.5 μm to 100 μm, 0.5 μm to 70 μm, 0.5 μm to 50 μm, 0.5 μm to 1000 μm, 5 μm to 1000 μm, 15 μm to 1000 μm, 5 μm to 400 μm, 5 μm to 100 μm, 5 μm to 50 μm, or 15 μm to 50 μm. In such a range, the adhesive layer may maintain excellent tack, and also the adhesive layer can be effectively protected from external factors. In addition, the adhesive layer includes the side cured part in a fine width within such a range, thereby controlling that an adhesive composition flows out at the time of being used for a thermo-compression process and the like, for example.

In addition, a side cured part may be formed in a thickness direction of an adhesive layer in a fine width. The side cured part formed in the thickness direction of the adhesive layer may mean a cured part formed from the first adhesive face to the second adhesive face in the same width or a changed width when observing a cross section of the adhesive layer as illustrated FIGS. 4 and 6.

The adhesive layer may be formed using a hot melt adhesive composition, for example. In the present specification, the term "hot melt adhesive composition" may mean an adhesive composition maintaining in a solid or semi-solid state at a room temperature, exhibiting adhesion by being melted when heat is applied, and having a type capable of tightly fixing an object as an adhesive layer or encapsulating layer after being cured. The term "room temperature" may mean a natural temperature without heating or cooling, and for example, the temperature of about 15° C. to 35° C., about 20° C. to 25° C., or about 25° C.

As an embodiment, a part except a side cured part of an adhesive layer may include an adhesive composition in an uncured state in a film-shape or sheet-shape. In the present specification, an adhesive layer except a side cured part as used herein may be called an uncured part. The term "uncured part" may mean a part without being subjected to an artificial curing process, such as a heat supply, an aging process, or an irradiation of an electromagnetic wave. Specifically, the uncured part may mean a part exhibiting a degree of curing of less than 80% or less than 50%.

As an adhesive layer, components capable of being cured, which is used in the art, may be used without limitation. The adhesive layer may include, for example, a curable resin.

Specific kinds of the curable resin may include, but are not particularly limited to, for example, various thermocurable or photocurable resins that are known in the art. However, the present invention is not limited thereto, and a curable resin may be a dual-curable resin capable of being both thermocured and photocured.

In the present specification, the term "thermocurable resin" means a resin capable of being cured through a proper heat supply or aging process, and the term "photocurable resin" means a resin capable of being cured by an irradiation of an electromagnetic wave. In addition, in this case, a category of an electromagnetic wave may include microwaves, IR, UV, X-rays, γ-rays, and also particle beam, such as α-particle beam, proton beam, neutron beam, and electron beam.

Specific kinds of a curable resin are not particularly limited as long as it has the abovementioned properties. For example, as a curable resin capable of having an adhesive property after being cured, there are resins, such as a resin having at least one functional group capable of being thermocured, such as a glycidyl group, an isocyanate group, a hydroxyl group, a carboxyl group, or an amide group, or a resin having at least one functional group capable of being cured by an irradiation of an electromagnetic wave, such as an epoxide group, a cyclic ether group, a sulfide group, an acetal group, or a lactone group. In addition, the specific kinds of the resin described above may include an acrylic resin, a polyester resin, an isocyanate resin, or an epoxy resin, but the present invention is not limited thereto.

As an embodiment, a curable resin may include an aromatic or aliphatic, or linear or branched epoxy resin.

Examples of such an epoxy resin may include one kind, or a mixture of two or more kinds of a cresol novolac epoxy resin, a bisphenol A epoxy resin, a bisphenol A novolac epoxy resin, a phenol novolac epoxy resin, a tetrafunctional epoxy resin, a biphenyl epoxy resin, a triphenol methane epoxy resin, an alkyl modified triphenol methane epoxy resin, a naphthalene epoxy resin, a dicyclopentadiene epoxy resin, or a dicyclopentadiene modified phenol epoxy resin.

An adhesive layer may further include a moisture absorbent. It is possible to provide an adhesive film having a maximized moisture-blocking effect by further including a moisture absorbent in the adhesive layer. In the present specification, the term "moisture absorbent" may be used as a general term for a component capable of blocking water or moisture by adsorbing or removing water or moisture flowing in from the outside or by interrupting a migration passage of water or moisture flowing in from the outside through a physical or chemical reaction. Examples of such a moisture absorbent may include a moisture reactive adsorbent or physical blocking agent, and also a mixture thereof.

The moisture reactive adsorbent as used herein adsorbs water, moisture, oxygen, or the like by chemically reacting with moisture, water, oxygen, or the like that is flowing inside an adhesive layer. The physical blocking agent as used herein can inhibit penetration of water or moisture by making a migration passage of water or moisture that is penetrating into an encapsulation structure longer and can maximize a property of blocking water and moisture through interactions with a matrix structure of a curable resin, a moisture reactive adsorbent, and the like.

Specific kinds of a moisture reactive adsorbent are not particularly limited as long as the adsorbent can chemically react with moisture. Examples of the moisture reactive adsorbent as used herein may include: one kind, or a mixture of two or more kinds of metal powder, such as alumina; metal oxides, such as alkali earth metal oxide or organic metal oxide; metal salt; or phosphorous pentoxide ($P_2O_5$).

In this case, examples of metal oxide may include lithium oxide ($Li_2O$), sodium oxide ($Na_2O$), barium oxide (BaO), calcium oxide (CaO), or magnesium oxide (MgO). Examples of metal salt may include: sulfates such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); metal halide, such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodine ($MgI_2$); metal chlorate, such as barium perchlorate ($Ba(ClO_4)_2$) or magnesium perchlorate ($Mg(ClO_4)_2$); and the like, but the present invention is not limited thereto.

A moisture reactive adsorbent in a properly processed state may be mixed in a composition. For example, when an adhesive film may be used for encapsulating an element or device that is susceptible to moisture or the like, a thickness of an adhesive layer may be about 40 μm or less depending on the kind of an element or device. In such a case, a moisture reactive adsorbent may need a grinding process. A milling process, such as a three-roll milling, a bead milling, or ball milling, may be used for grinding a moisture reactive adsorbent. In addition, when the adhesive film is used, for example, for encapsulating an organic electronic device having a top emission type or the like, transmittance of a cured adhesive layer or encapsulation layer itself is very important. Therefore, a small size of the moisture reactive adsorbent is required. Accordingly, a grinding process may be required for such a use.

In addition, it is preferable that such a moisture absorbent be uniformly distributed in an adhesive layer of the adhesive film. Especially, since moisture reactive adsorbents may react with moisture in the air, and thus aggregation among the adsorbents may easily occur, it is important that the moisture reactive adsorbent is uniformly distributed and mixed in a proper size in a resin composition forming the adhesive layer.

An average particle diameter of a moisture reactive adsorbent included in an adhesive layer may be 100 nm to 15 µm, 100 nm to 5 µm, or 0.5 µm to 15 µm so as to properly control reactivity with moisture and so as not to damage an element or device to be sealed, but the present invention is not limited thereto. In such a range, a reaction rate with moisture may properly be controlled, and thereby storage stability may be secured and an element or device to be sealed may not be damaged.

The adhesive layer as used herein may include a moisture reactive adsorbent in the amount of 1 part by weight to 100 parts by weight or 1 part by weight to 50 parts by weight relative to 100 parts by weight of a curable resin. By controlling content of a moisture reactive adsorbent in such a range, for example, when an adhesive film is used for encapsulating an element or device that is susceptible to moisture and the like, a moisture blocking property may be maximized within the range, in which the element or device is not damaged.

In the present specification, unless particularly defined otherwise, a unit "part by weight" means a weight ratio among all components.

An adhesive layer of an adhesive film may include a physical blocking agent (also referred to as inorganic filler) in addition to a moisture reactive adsorbent. A physical blocking agent may inhibit penetration of water or moisture by making a migration passage of water or moisture that is penetrating into a cured adhesive layer or encapsulation layer longer, and may maximize a property of blocking water and moisture through interactions with a matrix structure, a moisture reactive adsorbent, and the like. Specific kinds of the physical blocking agent may include, but are not particularly limited to, for example, one kind or a combination of two or more kinds of clay, talc, needle silica, lamellar silica, porous silica, zeolite, titania, zirconia, or montmorillonite.

A physical blocking agent may be a product having a surface treated with an organic material, for example, clay modified with dioctadecyl methyl ammonium chloride and the like, or may be used by further adding a coupling agent, in order to improve compatibility with a curable resin.

An adhesive layer may include 1 part by weight to 50 parts by weight or 5 parts by weight or 30 parts by weight of a physical blocking agent relative to 100 parts by weight of a curable resin, for example. Excellent property of blocking water or moisture and mechanical property may be provided and also sedimentation of a moisture absorbent may be prevented by controlling content of the physical blocking agent to be 1 part by weight or more. In addition, production of a film type is possible, and even in the case of forming in a thin film, excellent property of blocking moisture may be exhibited by controlling the content of the physical blocking agent to be 50 parts by weight or less.

An adhesive layer may further include a binder resin. A binder resin may play a role in improving moldability at the time of molding an adhesive layer in a film or sheet type.

A kind of a binder resin is not particularly limited as long as it has compatibility with other resins, such as a curable resin. A phenoxy resin, an acrylate resin, or a high molecular weight epoxy resin may be used as a binder resin. Here, a high molecular weight epoxy resin may mean, for example, a resin having a weight average molecular weight of about 2,000 to 70,000 or about 4,000 to 6,000. Examples of the high molecular weight epoxy resin may include a solid bisphenol A epoxy resin, a solid bisphenol F epoxy resin, or the like. A rubber component, such as a rubber having a high polarity functional group or a reactive rubber having a high polarity functional group, may be used as a binder resin. As an embodiment, a phenoxy resin may be used as a binder resin.

In the case of including a binder resin, a ratio thereof may be controlled depending on a desired physical property, but is not particularly limited. For example, the binder resin may be included in the amount of about 200 parts by weight or less, about 150 parts by weight or less, or about 100 parts by weight or less relative to 100 parts by weight of a curable resin. When the ratio of a binder resin is less than or equal to 200 parts by weight, an adhesive layer may effectively maintain its compatibility with all components and also play a role as an adhesive layer.

An adhesive layer may further include a curing agent capable of forming a matrix, such as a cross-linked structure, by reacting with a curable resin, or an initiator, for example, a cation photopolymerization initiator and the like, capable of initiating a curing reaction of a resin.

A kind of a curing agent may be properly selected depending on a kind of a functional group included in a resin or a curable resin to be used, but is not particularly limited. For example, when an epoxy resin is used as a curable resin, a curing agent for a general epoxy resin that is known in the art as a curing agent may be used. Specific examples thereof may include one kind, or two or more kinds of various amine-based compounds, imidazole-based compounds, phenol-based compounds, phosphorus-based compounds, acid anhydride-based compounds, or the like. However, the present invention is not limited thereto.

An adhesive layer may include, for example, a curing agent in the amount of 1 part by weight to 20 parts by weight or 1 part by weight or 10 parts by weight relative to 100 parts by weight of a curable resin. However, such content is only an example. In other words, the content of the curing agent may be changed depending on a kind of a curable resin or a functional group, content thereof, or a matrix structure or a crosslink density to be implemented.

A kind of an initiator as used herein, for example, a cation photopolymerization initiator may include, for example, but is not particularly limited to, a known cation polymerization initiator, such as aromatic diazonium salt, aromatic iodine aluminate, aromatic sulfonium salt, or iron arene complex. However, the present invention is not limited thereto.

In this case, the content of an initiator may be, for example, 0.01 parts by weight to 10 parts by weight or 0.1 parts by weight to 3 parts by weight relative to 100 parts by weight of a curable resin as used herein. When a cation photopolymerization initiator is used in such a range, a curing process may be sufficiently progressed, the content of ionic materials that are remained after curing may be minimized, and thereby durability of cured materials may be secured. In addition, even though a conjugated acid is formed due to properties of the initiator, and thereby there is a unfavorable aspect in terms of optical durability, when a cation photopolymerization initiator is used in the range, optical durability of cured materials may be secured and corrosion of a thin film may be prevented even in a state where the cured materials contact with a thin film including metals. However, the content of the initiator is not limited thereto, and may be properly controlled depending on specific kinds of the initiator and the curable resin.

Additives may be further included in view of a desired function of an adhesive layer, in which examples of additives may include additional filler for improving durability of cured materials, plasticizer, a UV stabilizer, an antioxidant, or a coupling agent for improving mechanical strength and adhesive strength.

A thickness of an adhesive layer is not particularly limited, but may be properly controlled in view of use of an adhesive film to be applied. As an embodiment, a thickness of an adhesive layer may be about 5 µm to 200 µm or about 5 µm to 100 µm. However, the present invention is not limited thereto.

An adhesive layer may have a single-layer or multi-layer structure. In the case of an adhesive layer having a multi-layer structure, contents or kinds of curable resins and moisture absorbents in each layer may be different from each other or identical to each other. As a method for allowing an adhesive layer to have a multi-layer structure, a method that is used in the art may be used without limitation as long as the method can form an adhesive layer having a multi-layer structure.

An adhesive film may further include a protective film in order to prevent sticking of foreign substances to an adhesive layer. The adhesive film may include at least one protective film. The at least one protective film may be present on an upper part and/or a lower part of an adhesive layer.

Specific kinds of a protective film as used herein are not particularly limited. Examples of a protective film may include a polyethyleneterephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-acrylic acid ethyl copolymer film, an ethylene-acrylic acid methyl copolymer film, a polyimide film, or the like.

In addition, a proper releasing treatment may be carried out on one side of a protective film. Examples of a releasing agent used for performing a releasing treatment of a protective film may include an alkyd-based, silicone-based, fluoride-based, unsaturated ester-based, polyolefin-based, wax-based releasing agent, or the like. Among these, the alkyd-based, silicone-based, or fluoride-based releasing agent may be used in terms of thermal resistance, but the present invention is not limited thereto.

A thickness of a protective film may be properly controlled according to usage to be applied, but the present invention is not particularly limited thereto. A thickness of a protective film may be, for example, about 10 µm to 500 µm or 20 µm or 200 µm. In such a range, a shape of the protective film is not modified during a process for preparing an adhesive film, and the adhesive film may be economically prepared. In addition, in the case of using at least two protective films, thicknesses of the at least the two protective films may be controlled to be identical to each other or different from each other. As an embodiment, in view of work characteristics of the adhesive film, the thickness of any one of the protective films may be set to be relatively thinner than that of another one of the protective films.

In this case, instead of a protective film, a metal thin film may be present on one side of an adhesive layer. As an embodiment, in a case where a metal thin film as used herein constitutes a gas barrier layer, it is possible to provide an adhesive film capable of implementing a flexible display. Examples of such a gas barrier layer may include a metal oxide thin film and the like. In addition, a thickness of the gas barrier layer may be properly controlled according to an applied field of an adhesive film. As an embodiment, in a case where a metal thin film is present on one side of an adhesive layer, the other side of the adhesive layer may have the protective film described above.

An adhesive film may be applied for encapsulating and thus protecting various objects. Especially, the film may be effective at protecting an object including an element that is susceptible to external components, for example, water or moisture. In this case, the element may mean any one of the components of an electronic device. Example of objects to which an adhesive film can be applied may include: an organic electronic device, such as a photovoltaic device, a rectifier, a transmitter, or an organic light emitting diode (OLED); a solar battery; or a secondary battery, but the present invention is not limited thereto.

Another embodiment of the present application provides a method for preparing an adhesive film as used herein. The method for preparing an adhesive film includes curing an adhesive layer in order to form an adhesive layer having a side cured part on a side face of at least any part of side faces connecting a first and second adhesive faces.

As an embodiment, a method for preparing an adhesive film may include forming an adhesive layer before curing the adhesive layer.

Forming of an adhesive layer may include, for example, a first step of forming a coating film by applying an adhesive composition on a protective film; and a second step of forming an adhesive layer by drying the coating film. In addition, compressing an additional protective film on the adhesive layer or depositing a metal thin film on the adhesive layer may be further carried out as a third step.

The first step may include preparing an adhesive composition by dissolving or distributing components included in an adhesive layer, such as a curable resin in a proper solvent. In this process, kinds or contents of all the components included in the adhesive composition may be properly controlled according to a desired function and film moldability.

In a case where time for drying a solvent is extremely long or drying at high temperature is required, since there may be a problem in terms of durability of an adhesive film or work characteristics, such a solvent may be properly selected considering such a point, but the present invention is not particularly limited thereto. Examples of the solvent may include one kind or a combination of two or more kinds of methylethylketone (MEK), acetone, toluene, dimethylformamide (DMF), methyl cellosolve (MCS), tetrahydrofurane (THF), N-methylpyrrolidone (NMP), or the like.

An example of a method for applying the adhesive composition prepared as described above on a protective film may include, but is not limited to, known methods, such as knife coating, roll coating, spray coating, gravure coating, curtain coating, comma coating, or rib coating, without limitation.

In a second step, a coating film obtained in the first step is dried to form an adhesive layer. In other words, in the second step, an adhesive layer may be formed by drying and removing a solvent through heating a coating film applied on a protective film. At this time, a condition for drying is not particularly limited, and for example, the drying may be carried out at a temperature of 10° C. to 200° C., 20° C. to 200° C., 30° C. to 200° C., 50° C. to 200° C., or 70° C. to 200° C. for 1 to 10 minutes.

After the second step, a third step may be further carried out to compress an additional protective film or deposit a metal thin film on an adhesive layer formed on a film.

As an embodiment, compressing a protective film on an adhesive layer may be performed by a hot roll laminate or press process. At this time, such a compression may be performed by a hot roll laminate method in view of efficiency and possibility of continuous process. Specifically, the compression may be performed at a temperature of about 10° C. to 100° C. and pressure of about 0.1 kgf/cm$^2$ to 10 kgf/cm$^2$, for example. However, the present invention is not limited thereto.

As another embodiment, a metal thin film may be deposited on an adhesive layer. Examples of the metal thin film may include a metal oxide thin film. As a method for depositing the metal thin film, it is possible to use a method that is used in the art without specific limitation. The method for depositing a metal thin film may be performed, for example, by an atomic layer deposition method or a chemical vapor deposition method.

An unprocessed adhesive film formed as described above includes an adhesive layer in an uncured state. Then, a step for curing an adhesive layer is performed to prepare an adhesive film having a side cured part. A step for curing an adhesive layer may be performed using a method that is well known in the art without limitation. For example, a step for curing an adhesive layer may be performed by a method for supplying heat to a corresponding region to have a cured part, a method for aging a corresponding region to have a cured part, a method for irradiating an electromagnetic wave to a corresponding region to have a cured part, or at least two methods thereof.

Figure 8:
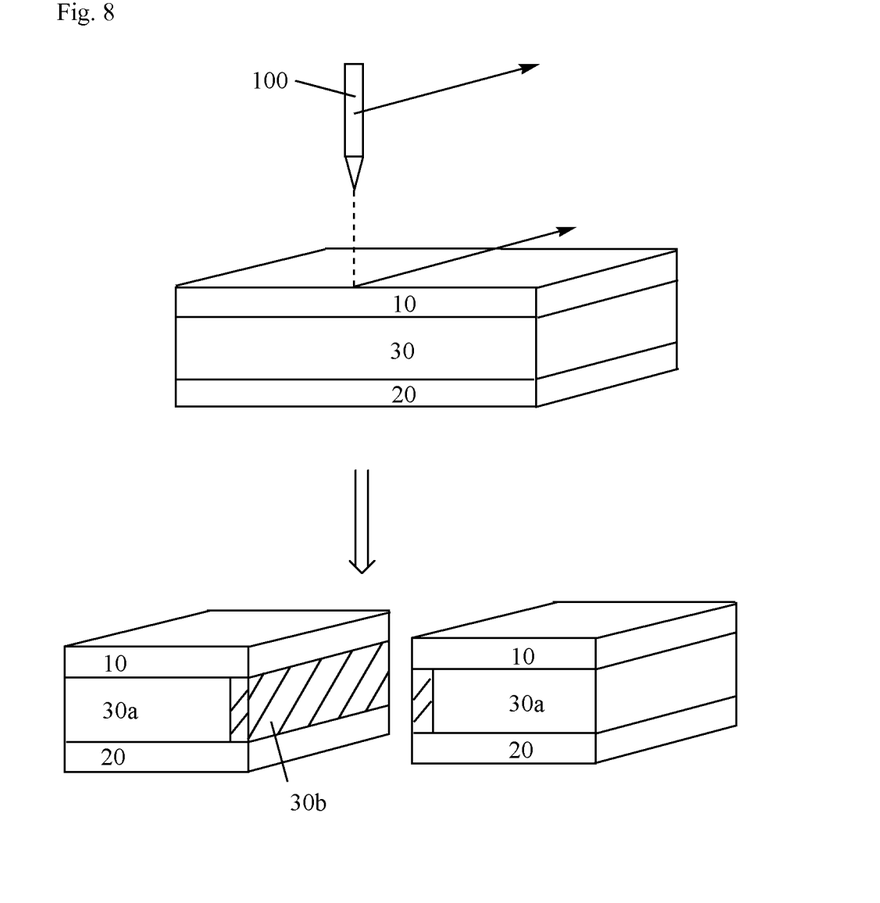
FIG. 8 is a schematic diagram illustrating part of a method for preparing an adhesive film according to an example.

As an embodiment, a step for curing an adhesive layer may be performed by a method for supplying heat to a corresponding region to have a cured part. In addition, as another embodiment, the method for supplying heat may be performed using a laser. In other words, the step for curing the adhesive layer may be performed, for example, by cutting an adhesive film in a thickness direction of the adhesive film by a laser. As illustrated in FIG. 8, a large area adhesive film in an uncured state may be cut to have a desired size using a laser cutter 100. At this time, a cut face cut by the laser cutter may be a side face of the adhesive layer after being cut. In addition, as an embodiment, the cut face or side face of the adhesive film contacting with a laser may be cured by the laser. For this reason, cutting of the adhesive film and forming of the side cured part of the adhesive film may be performed in one process, for example, a laser processing process. In the case of cutting the adhesive film by the laser processing process, swelling phenomenon of the cut face between layers of the adhesive film may be prevented.

Especially, a side face curing of an adhesive layer may be controlled, for example, according to an output and/or a repetition rate of a laser. As an embodiment, the output of the laser may be controlled to be about 0.1 W to 10 W, 0.1 W to 8 W, 0.1 W to 5 W, 1 W to 10 W or 1 W to 5 W. Formation of a side cured part and cut of an adhesive film may be progressed at the same time by controlling the output of the laser in such a range. In addition, the output of the laser is controlled in such a range, and thereby it is possible to prevent insufficient cutting of an adhesive film or uncured part from being remained in a region to be intended to form a side cured part.

In addition, as an example, a repetition rate of a laser may be controlled to be about 3 kHz to 50 kHz, 3 kHz to 40 kHz, 3 kHz to 30 kHz, 10 kHz to 50 kHz, 10 kHz to 40 kHz, or 10 kHz to 30 kHz. Cutting of an adhesive film and curing of the intended region may be properly carried out by controlling the repetition rate of the laser in such a range.

As the laser, a laser that is known in the art may be used without limitation as long as the laser can output the above-mentioned output.

As an embodiment, a line width of laser may be properly controlled according to a width of a side cured part. In order to control the width of the side cured part in the above-mentioned range, the line width of the laser may be controlled, for example to be 10 μm to 500 μm, 10 μm to 300 μm, 10 μm to 100 μm, or 10 μm to 80 μm.

An adhesive film may be prepared by further including a process that is generally performed in the art in addition to the above-mentioned processes for preparing an adhesive film.

Another embodiment of the present application provides an organic electronic device sealed with the adhesive film described above. The organic electronic device may include a substrate; an organic electronic element formed on the substrate; and an encapsulation layer formed with an adhesive film by encapsulating the entire surface of the organic electronic element.

The organic electronic device has excellent moisture blocking property and endurance reliability by forming an encapsulation layer with the adhesive film described above.

The encapsulation layer may be formed using a method for encapsulating an organic electronic element, the method being known in the art in addition to the method using the adhesive film described above. For example, the encapsulation layer may be formed by attaching an adhesive film on the face of a substrate formed with the organic electronic element to cover the entire surface of the organic electronic element, and then curing. The adherence of the adhesive film may be performed using a vacuum compressing, thermal compressing, or combination thereof, for example. As an embodiment, the adherence of the adhesive film may be performed at a temperature of 50° C. to 90° C. in a vacuum compressing method. In addition, the curing of the adhesive film may be performed by heating to a temperature range of 70° C. to 110° C. or irradiating with an electromagnetic wave. In a general case, it is difficult to form a uniform encapsulation layer because for the adhesive film, its fluidity increases due to a high temperature, and thus a part of an adhesive composition included in an adhesive layer flows or leaks out. However, in the case of the adhesive film having the side cured part described above, even though the adhesive layer melts and thus its fluidity increases at room temperature or higher, the side cured part may prevent an effusion of an adhesive composition to the outside. For this reason, the adhesive film having the side cured part described above can have an encapsulation layer having a uniform thickness.

Degrees of curing between a part of a side cured part before curing and a part of uncured part after curing may be identical to each other or different from each other in an encapsulation layer formed by curing an adhesive layer.

The organic electronic device may be provided in a general constitution of the art except that an encapsulation layer is constituted using the film described above. For example, the organic electronic device may further include an encapsulation substrate. A glass, metal, polymer film, or the like that is generally used in the art may be used as a substrate and an encapsulation substrate. In addition, the organic electronic device may include, for example, one pair of electrodes and an organic material layer formed between one pair of electrodes. Here, any one of one pair of electrodes may be constituted with transparent electrode. In addition, examples of the organic material layer may include a hole transporting layer, a luminescent layer, an electron transporting layer, and the like.

Advantageous Effects

According to an exemplary adhesive film of the present application, fluidity of an adhesive can be controlled in the case of applying the adhesive between objects to be subsequently adhered to each other and then thermal-compressing by including an adhesive layer with cured side faces contacting with the outside. Such an adhesive film is used, for example for assembling a panel and the like, and thereby a defect rate at the time of assembling a panel and the like can be reduced and excellent work characteristics can be provided. In addition, before applying to a panel or the like, a moisture absorbent included inside an adhesive layer of an adhesive film can be protected from external moisture or the like, thereby being easily stored, and also when it is applied to a product, reliability of life span, and the like can be secured.

DESCRIPTION OF REFERENCE NUMERALS 1, 2: protective film
3: adhesive layer
10, 20: protective film or metal thin film
30: adhesive layer
30a: uncured part
30b: side cured part
301: first adhesive face
302: second adhesive face
303: side face
100: laser

MODES OF THE INVENTION

Hereinafter, an adhesive film as used herein will be described in detail with reference to Example and Comparative Example. However, the range of such an adhesive film is not limited to the following Example.

Hereinafter, physical properties in Example and Comparative Example were estimated using the following methods.

1. Estimation of Moisture Blocking Property

A calcium test was performed in order to estimate moisture blocking property of an adhesive film prepared in Example or Comparative Example. Specifically, calcium (Ca) having the area of 80 mm (width)×80 mm (length) and a thickness of 100 nm was deposited on a glass substrate having a size of 100 mm×100 mm. An adhesive film face of a cover glass transferred with an adhesive film having a size of 90 mm×90 mm processed in Example or Comparative Example was disposed to face a calcium-deposited face of the glass substrate. Subsequently, an adhesive film was contacted to seal the overall glass substrate deposited with calcium, and then heated and compressed at 80° C. for 1 minute using a vacuum press. Then, the adhesive film was cured in a high temperature dryer at 100° C. for 3 hours to prepare a specimen. The specimen thus obtained was maintained in a constant temperature and humidity chamber under environments of the temperature of 85° C. and 85% R.H., and then the point of starting when calcium became transparent by an oxidation reaction due to penetration of moisture was estimated.

2. Coherent Estimation

It was observed with naked eyes whether an adhesive composition leaked out on a side face of an adhesive film contacting with external air with respect to each of the specimens prepared for estimating the moisture blocking property.

<Coherence Estimation Criteria>

Good: the case of observing an uniform side face without leaking of an adhesive composition on a side face of an adhesive film; and Poor: the case of observing a non-uniform side face because an adhesive composition leakes out on a side face of an adhesive film.

Example 1

(1) Preparation of Curable Adhesive Composition

A Solution of a Moisture Absorbent was Prepared by Adding 50 g of CaO (Junsei) as a moisture absorbent to methylethylketone in a concentration of 30% by weight. Subsequently, such a solution was milled for 24 hours through a ball milling process. Separately, 100 g of a liquid epoxy resin (YD-128 manufactured by KUKDO CHEMICAL CO., LTD.) and 50 g of a phenoxy resin (YP-50 manufactured by DONGDO CHEMICALS CORPORATION) were added to a reactor at room temperature, and then diluted with methylethylketone. Then, the solution thus obtained was homogenized. The prepared moisture blocking solution was added to the homogenized solution, 4 g of imidazole (SHIKOKU CHEMICALS CORPORATION) that is a curing agent was added to the homogenized solution, and then stirred for 1 hour at high speed to prepare a curable adhesive composition.

(2) Preparation of Adhesive Film

The curable adhesive composition prepared as described above was applied on a release face of a release PET using a comma coater and then dried in a drier at 130° C. for 3 minutes to form an adhesive layer having a thickness of 20 μm.

A separate release PET was laminated to the adhesive layer to prepare a non-processed adhesive film.

In order to process the adhesive film prepared as described above, the adhesive film was cut and processed in a square form of 90 mm×90 mm by irradiating a laser having a line width of about 50 μm under a condition of 2 W and 20 kHz using a laser 355. At this time, a side cured part was formed in a width of about 30 μm along a cut surface of the adhesive film.

Comparative Example 1

An adhesive film was prepared using the same method as Example 1, except that a non-processed adhesive film was cut using a wooden pattern punching in order to process the non-processed adhesive film of Example 1. In this case, since a curing reaction did not occur on the cut surface, there was no side cured part.

TABLE 1

| | Moisture Blocking Property[a] | Coherence Estimation Results |
|---|---|---|
| Example 1 | 500 hours | Good |
| Comparative Example 1 | 400 hours | Poor |

[a]the point of starting transparency of calcium

The invention claimed is:

1. An adhesive film, comprising:
an adhesive layer which comprises a first adhesive face;
a second adhesive face; and
side faces connecting the first adhesive face and the second adhesive face,
wherein side cured parts are formed on at least any part of the side faces, and
wherein the adhesive layer comprises an adhesive composition in an uncured state in a film-shape or a sheet-shape.

2. The adhesive film of claim 1, wherein the side cured parts are formed on the overall side faces.

3. The adhesive film of claim 1, wherein a width of at least one side cured part is 0.5 μm to 1000 μm.

4. The adhesive film of claim 1, wherein the adhesive composition comprises a curable resin and a moisture adsorbent.

5. The adhesive film of claim 1, further comprising a protective film or a metal thin film, wherein the protective film or the metal thin film is disposed on one or both of the first adhesive face and the second adhesive face.

6. A method for preparing the adhesive film of claim 1, comprising forming the adhesive layer comprising side cured parts by curing the adhesive layer comprising the first adhesive face, the second adhesive face, and the side faces.

7. The method of claim 6, wherein the forming of the adhesive layer is performed by cutting the adhesive film in a thickness direction by a laser.

8. The method of claim 7, wherein the forming of the adhesive layer uses a laser having a line width of 10 μm to 500 μm.

9. The method of claim 7, wherein the forming of the adhesive layer is performed in a state of controlling an output of the laser to 0.1 W to 10 W.

10. The method of claim 9, wherein the forming of the adhesive layer is performed in a state of controlling a repetition rate of the laser to 3 kHz to 50 kHz.

11. An organic electronic device, comprising:
a substrate;
an organic electronic element formed on the substrate; and
an encapsulation layer comprising the adhesive film of claim 1, the encapsulating layer encapsulating an entire surface of the organic electronic element.

12. The adhesive film of claim 1, wherein the side cured parts are formed on the overall side faces of the adhesive layer and surround an uncured part of the adhesive layer, the uncured part comprising at least a portion of the first adhesive face and at least a portion of the second adhesive face.

13. The adhesive film of claim 12, wherein the side cured parts comprise a moisture absorbent.

14. The adhesive film of claim 12, wherein the moisture absorbent is uniformly distributed in the adhesive layer.

* * * * *